United States Patent [19]
Windisch, Jr. et al.

[11] Patent Number: 5,990,416
[45] Date of Patent: Nov. 23, 1999

[54] CONDUCTIVE METAL OXIDE FILM AND METHOD OF MAKING

[75] Inventors: Charles F. Windisch, Jr., Kennewick; Gregory J. Exarhos, Richland, both of Wash.

[73] Assignee: Battelle Memorial Institute, Richland, Wash.

[21] Appl. No.: 09/061,827

[22] Filed: Apr. 16, 1998

[51] Int. Cl.$^6$ ............................................. H01L 25/00
[52] U.S. Cl. ............................ 136/255; 438/69; 438/85
[58] Field of Search .................... 438/69, 85; 136/255

[56] References Cited

U.S. PATENT DOCUMENTS

| | | | |
|---|---|---|---|
| 4,000,346 | 12/1976 | Dowell | 428/336 |
| 5,078,803 | 1/1992 | Pier et al. | 136/256 |
| 5,578,502 | 11/1996 | Albright et al. | 437/4 |

OTHER PUBLICATIONS

Electrochemically Reduced Polycrystalline Tin Oxide Thin Films, H.Feng, S.J. Laverty, P. Magure, J. Molloy, and B.J. Meenan, J. Electrochem. Soc. vol. 143, No. 6, Jun. 1996.

Optical Properties of Aluminum Doped Zinc Oxide Thin Films Prepared by RF Nagnetron Sputtering, T. Minami, H. Nanto and S. Takata, Japanese Journal of Applied Physics, vol. 24, No. 8, Aug. 1985, pp. L605–L607.

L.A. Harris and R. Schumacher, J Electrochem Soc, 127, 1186 (1980).

Electrochemical Patterning of Tin Oxide Films, BJ Baliga, SK Ghandhi, J. Electrochem. Soc, vol. 124, No. 7, Jul. 1997.

Reduction of $CO_2$ on Fluorine–Doped $SNO_2$ Thin–Film Electrodes, R Shiratsuchi, K hongo, G Nogami, S Ishimaru, J. Electrochem. Soc., vol. 139, No. 9, Sep. 1992.

Electrochemical Activation of Rutile Electrode Photosensitivy, AL Asatiani, TV Dzhavrishvili, ZA Rotenberg, Institute of Organic Chemistry and Electrochemistry Academy of Sciences of the Georgian SSR, Translated from Elektrokhimiya, vol. 13, No. 2, p. 309, Feb. 1977.

*Primary Examiner*—Mark Chapman
*Attorney, Agent, or Firm*—Paul W. Zimmerman

[57] ABSTRACT

The present invention is a method for reducing a dopant in a film of a metal oxide wherein the dopant is reduced and the first metal oxide is substantially not reduced. The method of the present invention relies upon exposing the film to reducing conditions for a predetermined time and reducing a valence of the metal from a positive valence to a zero valence and maintaining atoms with a zero valence in an atomic configuration within the lattice structure of the metal oxide. According to the present invention, exposure to reducing conditions may be achieved electrochemically or achieved in an elevated temperature gas phase.

17 Claims, 3 Drawing Sheets

CONDUCTIVE METAL OXIDE FILM AND METHOD OF MAKING

This invention was made with Government support under Contract DE-AC06-76RLO 1830 awarded by the U.S. Department of Energy. The Government has certain rights in the invention.

FIELD OF THE INVENTION

The present invention is a metal oxide film and method of making same. The metal oxide film is a transparent conductive film and the method relies upon reducing a metal in the metal oxide film.

BACKGROUND OF THE INVENTION

Photovoltaic cells for converting light to electricity have been implemented in products from remote electrical supply systems to calculators. Flat panel displays for computers, televisions and calculators are also widely used. Photovoltaic cells and flat panel displays consist of a semiconductor coated with a transparent conductive metal oxide thin film. In a photovoltaic cell, the semiconductor material is where the light is converted to electricity, and the conductive thin film collects the electricity and conducts it to a buss. The conductive thin film also serves to protect the semiconductor from dust and environmental degradation. In a photovoltaic cell, the coating must be optically transparent to permit light to reach the semiconductor, and in a flat panel display, the coating must be optically clear in order to see the information on the display, hence the adjectives transparent conductive. Because the only known materials to exhibit these properties are metal oxides, and because light transmission is improved with thinner rather than thicker layers of the material, they are fully specified as transparent conductive metal oxide thin film.

These films are presently made by several process, for example sputtering, spray pyrolysis, chemical vapor deposition, and dip coating. In order to have the desired properties of transparency and conductivity, the sputtered or deposited material must have from about 1 to about 2 atomic percent of the metal in the metal oxide in a reduced state. Outside that range, either the transparency, conductivity or both suffer. It is very difficult to control the sputtering and chemical vapor deposition processes in terms of the amount of material that is reduced. Thus, the resulting metal oxide coating must be tested to identify those with the desired characteristics of transparency and conductiivity.

Oxides that have been found to be most useful as transparent conductive metal oxide thin films are tin oxide ($SnO_2$), indium tin oxide ($InSnO_2$) and zinc oxide (ZnO).

A paper ELECTROCHEMICALLY REDUCED POLYCRYSTALLINE TIN OXIDE THIN FILMS, H.Feng, S. J. Laverty, P. Magure, J. Molloy, and B. J. Meenan, J. Electrochem. Soc. Vol. 143, No. 6, June 1996, reports conductivity enhancement in polycrystalline tin oxide thin films by electroplating copper onto sidewalls of the polycrystalline tin oxide thin films.

U.S. Pat. No. 4,000,346 to Dowell discusses optically transparent electrically conducting coatings of noble metal oxides. Dowell's films are made by brushing a noble metal salt solution onto an optically transparent substrate, followed by heating from about 350° C. to about 700° C. in an inert atmosphere to form the conductive layer. Disadvantages of this invention include, the high temperature necessary for formation of the conductive layer, and the need for an inert atmosphere.

U.S. Pat. No. 5,078,803 to Pier et al. discusses solar cells (photovoltaic cells) with hazy zinc oxide as contrasted with optically clear zinc oxide and reports an optimum balance of optical and electrical properties for photovoltaic devices. The haziness is achieved either by variation in formation parameters (e.g. chemical vapor deposition) and/or by post formation treatment. Variation of formation parameters is by control of the relative rate of introduction of dopant during deposition, and post formation treatment is by etching with an acid (e.g. oxalic acid) or a base (e.g. NaOH).

U.S. Pat. No. 5,578,502 to Albright et al. describes an improved photovoltaic cell manufacturing process wherein after depositing a film doped with p-type material (e.g. p-type cadmium telluride) the deposited material is subjected to an impurity gettering step in oxygen followed by a recrystallization step in an inert gas.

The paper OPTICAL PROPERTIES OF ALUMINUM DOPED ZINC OXIDE THIN FILMS PREPARED BY RF NAGNETRON SPUTTERING, T. Minami, H. Nanto and S. Takata, Japanese Journal of Applied Physics, Vol. 24, No. 8, August 1985, pp L605–L607, reports average transmittance above 85% for ZnO doped with $Al_2O_3$.

The paper by L. A. Harris and R. Schumacher, J Electrochem Soc, 127,1186 (1980) showed hydrogen charging of $TiO_2$. However, titania treated in this manner is not useful as a transparent conductive metal oxide because the charging effect can be temporary and reversible to an uncharged state.

In spite of the reported advances, the fact remains that achieving 1–2 atomic percent metal reduction is problematic and difficult to control. Hence, there is a need for a method of reliably reducing up to about 2 atomic percent of the metal in a metal oxide.

SUMMARY OF THE INVENTION

The present invention is a transparent conductive metal oxide that is doped with a noble metal. The noble metal is reducible independently of the metal in the metal oxide and the reduced state of the noble metal is stable and resists reversing to an oxidized state.

The method of the present invention is a method for reducing a metal of a second metal oxide (dopant) in a film of a first metal oxide in an electrically conductive and visibly transparent film, wherein the dopant is reduced and the first metal oxide is substantially not reduced. Substantially not reduced is defined as an amount of reduction that is ineffective to interfere with or alter the properties of the film. More specifically, substantially not reduced is an amount of reduction less than 0.5 atomic percent, preferably less than 0.1 atomic percent and most preferably less than 0.01 atomic percent.

The method of the present invention relies upon exposing the film to reducing conditions for a predetermined time and reducing the valence of a portion of the metal from a positive valence to a zero valence and maintaining atoms with a zero valence in an atomic configuration within the lattice structure of the metal oxide. Reducing conditions are achieved both electrochemically, with or without neutral hydrogen generated during reduction of the dopant, or in an atmosphere of neutral hydrogen at an elevated temperature. Neutral hydrogen is herein defined as each hydrogen atom having both a proton and a neutron, in other words non-ionic. The neutral hydrogen may be atomic or molecular hydrogen.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
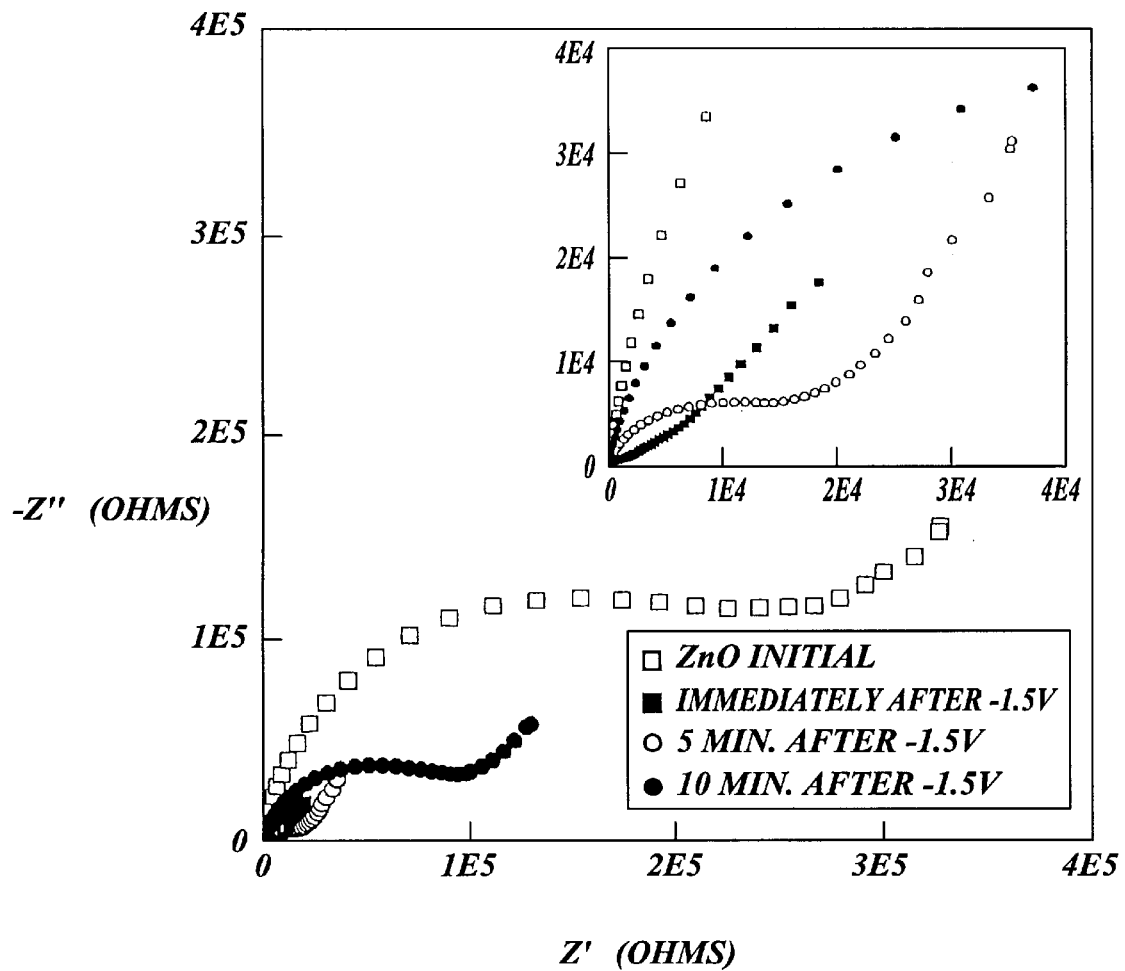
FIG. 1 is an impedance plot of neat ZnO before and after electrochemical reduction.

The material of the present invention is a noble metal oxide doped transition metal oxide film wherein the noble metal of the noble metal oxide is selectively reduced and maintains its reduction and is resistant to reversal to an oxidized state. More specifically, the amount of noble metal oxide is from about 0.1 to about 10 atomic %, preferably from about 1.0 to about 2.0 atomic %. The noble metal is selected from the group of classic noble metal, specifically gold (Au), silver (Ag), platinum (Pt), palladium (Pd); group 13, specifically Indium (In), gallium (Ga); group 14, specifically germanium (Ge), tin (Sn), lead (Pb); group 15, specifically arsenic (As), antimony (Sb), bismuth (Bi), other transition metal including copper (Cu) and combinations thereof. The first metal oxide is preferably zinc oxide, but may be titanium oxide, tin oxide and combinations thereof.

The method of the present invention for reducing a metal in a film of a metal oxide having a lattice structure, has the steps of exposing the film to reducing conditions for a predetermined time and reducing the valence of the dopant metal from a positive valence to a zero valence and maintaining atoms with a zero valence in an atomic configuration within the lattice structure. The result of reducing the dopant metal is a transparent conductive metal oxide film.

The film may be a stand-alone film, but is usually on a substrate. The substrate is preferably a conducting substrate including but not limited to semiconductor, conductive polymer, metal or combinations thereof.

In a preferred method, exposing the doped film to reducing conditions has the steps of:

(a) using the doped film as a first electrode in an electrochemical cell;

(b) placing the first electrode together with a counter electrode in an electrolyte in an electrochemical cell;

(c) selecting a voltage sufficient to reduce the dopant;

(d) applying the voltage and maintaining the voltage substantially constant until the current falls to nearly zero indicating completion of the reduction; and (e) removing the reduced metal oxide from the electrochemical cell.

In the preferred embodiment, the dopant metal has a lower electrochemical reduction potential than a first metal of the metal oxide so that the dopant metal oxide is preferentially or selectively electrochemically reduced over any other metal oxide present in the film. When the dopant metal has a reduction potential less than the reduction potential of hydrogen, direct electrochemical reduction of the dopant metal occurs. When the dopant metal has a reduction potential greater than the reduction potential of hydrogen, the potential is set to reduce hydrogen that then reduces the dopant metal.

Alternatively, exposing the film to reducing conditions has the steps of:

(a) exposing the film to a reducing atmosphere at a temperature of at least about 400° C; and (b) withdrawing the film from the atmosphere after a predetermined time. The reducing atmosphere is an atmosphere that includes neutral hydrogen gas. Other gases may be present, for example inert gases. Additionally, oxidizing gases may be present but are either in an ineffective quantity or are completely reacted with some of the hydrogen. It is preferred that the concentration of hydrogen be less than an explosive amount if combined with oxygen. Accordingly a preferred amount of hydrogen is about 4 vol% with the balance an inert gas including but not limited to nitrogen, argon, and combinations thereof.

Films having a reduced dopant are found to be more stable and potentially long lived compared to undoped films. For example for a Pt doped ZnO, re-oxidation of Zn in the ZnO is more favored than oxidation of the Pt to PtO.

Experimental Procedure for Examples

Substrates of aluminum and silicon having a surface area of about 1.3 $cm^2$ were coated with 100 nm thick zinc oxide film (both neat and doped) either by spin casting alcohol solutions or by sputtering. The alcohol solutions contained 1 M zinc acetylacetonate $(CH_3COCH{=}C(O)CH_3)_2.Zn.xH_2O$ as a zinc precursor in ethanol/water mixture having 0–30 vol% water. Some films were undoped and others were doped with a metal dopant to an amount of 1–2 atomic percent in the film. The dopant was in the form of a metal salt. The amount of zinc precursor was 2 g per 20 ml of ethanolic solution. Glacial acetic acid was added (1–2 ml) which acidified the basic alcohol solutions to completely dissolve the zinc acetylacetonate and prevent precipitation of the metal salt.

The alcohol solution was stirred and heated at 333 K for several minutes, cooled to room temperature then filtered through a 0.45 $\mu$m pore size Teflon filter. The filtered solution was either spin cast onto an n-type conducting silicon or polished aluminum, or sputtered onto silica and silicon substrates.

Spin casting was done at 3500 rpm for 50 s. The spin cast films were heat treated at 675 K for 5 min in air to generate the wurtzite crystalline phase. Spin casting should be done within about 5 hours of making the alcohol solutions, especially the doped alcohol solutions since the dopants tend to reduce and form colloidal suspensions over time. Multiple coatings were used to obtain a film thickness of 250 nm.

Films that were sputter deposited were put onto silica and silicon substrates using 150 Watts of rf power. A 30 vol % $O_2/Ar$ gas mixture was used and the total chamber pressure was 1.5 mTorr. Substrates were loaded onto a plenary stage and located 25 cm from the oxide target; the substrate temperature was estimated to be about 425 K. Film thickness ranged from 200 to 700 nm and deposition rates were about 0.2 nm/sec. Two inch diameter targets of, for example ZnO, $(Al_2O_3)_{0.01}(ZnO)_{0.99}$ and $(Ga_2O_3)_{0.01}(ZnO)_{0.99}$ were made from powders compacted under 1 kbar of pressure and sintered at 1300 K for 2 hours. The powders were made according to the method described in U.S. Pat. No. 5,114,702 herein incorporated by reference.

Exposure to reducing conditions was done both in the gas phase with neutral hydrogen at elevated temperature and electrochemically both with and without neutral hydrogen. Gas phase hydrogen reduction was done by subjecting heated coated substrates (675–725 K) to 1 atm of flowing 4 vol % hydrogen in argon for times up to two hours. The $H_2$/Ar flow was maintained during heating and cooling (20 K/min).

Electrochemical reduction was done by placing the coated substrates in an electrochemical cell and connecting them as the working or first electrode. About 1 $cm^2$ of the film was immersed into an electrolyte solution with the remaining surface area exposed to air as an analytical control. The reference electrode was a saturated calomel electrode and the reference electrode was platinum foil. The electrolyte was a standard phosphate pH=7 buffer solution. The film coated working electrode was polarized cathodically at a potential and for a duration that depended on the sample.

An EG&G PAR 273 potentiostat (Princeton, N.J.) and associated software was used for analysis.

Optical transmission and reflectance measurements were obtained for wavelengths from 200 nm to 3300 nm using a Varian Cary 5 double beam spectrophotometer. Ellipsometry measurements were obtained with an ISA J-Y UVISEL Phase Modulated Spectroscopic Ellipsometer. Data were recorded from 0.8 to 4.6 eV with a step size of 0.05 eV. A 56° angle of incidence and an integration time of 1 s per point were used. Black tape placed on the back of the transparent silica samples prevented back reflection of the probe beam. The UVISEL Ellipsometric Software Version 4.15 was used for data analysis. Raman spectra were excited using 488 nm excitation from an Ar+ ion laser imaged through an Olympus optical microprobe that was interfaced to the entrance port of a Spex Model 1477 triple spectrometer equipped with a $N_2$ cooled silicon CCD detector. An 80 power objective (0.75 na) was used to image the prove laser onto the film (488 nm, 30 mW at the sample) and collect the backscattered light. Long exposure times (hours) were mandated by the small amount of material in the thin films within the probe beam footprint.

X-ray photoelectron spectra of films deposited on Al or silica substrates were acquired using a Physical-Electronics Quantum 2000—Scanning ESCA spectrometer incorporating a hemispherical analyzer. Monochromatic Al $K_\alpha$ X-rays were used to generate the spectra (A 40W and 200 $\mu$m x-ray beam size was scanned over an area of 400×400 $\mu m^2$).

EXAMPLE 1

An experiment was conducted to demonstrate metal reduction in undoped (ZnO) and doped metal oxide (Al:ZnO) according to the prior art.

The dopant Al was from $Al(NO_3)_3 \cdot 9H_2O$.

Undoped and doped ZnO films, for example, were polarized sufficiently to produce neutral hydrogen by decomposition of the electrolyte By reversing the potential, the Zn and/or the Al were reoxidized. Thus, neither neat ZnO nor Al:ZnO resisted re-oxidation.

Resistivity for gas phase reduced neat ZnO films is shown in Table E1 1.

TABLE E1-1

Resistivity of neat ZnO film following Reduction at 675K in 1 atm flowing Ar/4 vol % $H_2$

| Substrate | Deposition Method | Film Thickness (nm) | Reducing Time (min) | ρ (ohm-cm) |
|---|---|---|---|---|
| $SiO_2$ | Solution | 250 | 0 | >$10^6$ |
| $SiO_2$ | Solution | 250 | 10 | 2.2 |
| Si | Solution | 250 | 10 | 2.7 |
| $SiO_2$ | Sputtered | 500 | 30 | 0.013 |

Resistivity of gas phase reduced aluminum doped zinc oxide films is shown in Table E1-2.

TABLE E1-2

Resistivity of Al doped ZnO following reduction in 1 atm flowing Ar/4 vol % $H_2$

| Film | Substrate | Film Thickness (nm) | Deposition Method | Reducing Conditions (min/° K.) | ρ (ohm-cm) |
|---|---|---|---|---|---|
| 2% Al:ZnO | $SiO_2$ | 650 | Sputtered | 30/675 | 0.0029 |
| 2% Al:ZnO | $SiO_2$ | 256 | Solution | 30/675 | 0.0037 |

Further data is shown in FIG. 1 as an impedance plot for electrochemically reduced neat ZnO. From the origin to the first point of inflection, the curve is a semicircle referred to in the art as a "loop". The diameter of the semicircle is substantially the resistivity of the material. Accordingly, the smaller the diameter, the smaller the resistivity or the greater the conductivity. The neat ZnO prior to electrochemical reduction shows a portion of a semicircle having a large diameter indicating a large resistivity for neat ZnO in an oxidized condition. The data (closed squares and open circles) taken immediately after and 5 minutes after a −1.5 V electrochemical reduction treatment indicate conductivity by the reduced diameter semicircles. Note, however, the tendency of the reduced ZnO to re-oxidize as shown by the closed circles forming a semicircle of increased diameter approaching the diameter of the un-reduced neat ZnO. As the neat ZnO re-oxidized, there was observed a visible bleaching of color from the ZnO film. Re-oxidation was accomplished by reversing the cell to an oxidative potential.

A similar bleaching was observed for the Al:ZnO films. The Al:ZnO films were also measured for conductivity with a voltmeter after electrochemical reduction showing that after a time, there was an increase in resistivity.

Thus, neat ZnO and Al:ZnO did not resist re-oxidation.

EXAMPLE 2

An experiment was conducted to demonstrate performance of noble metal doped metal oxide films according to the present invention.

The noble metal salts were: for Au was from $HAuCl_4 \cdot 3H_2O$, Pt from $PtCl_4$, Pd from $Pd(NH_3)_4Cl_2$, and Ga from $Ga(NO_3)_3 \cdot 9H_2O$.

Figure 2:
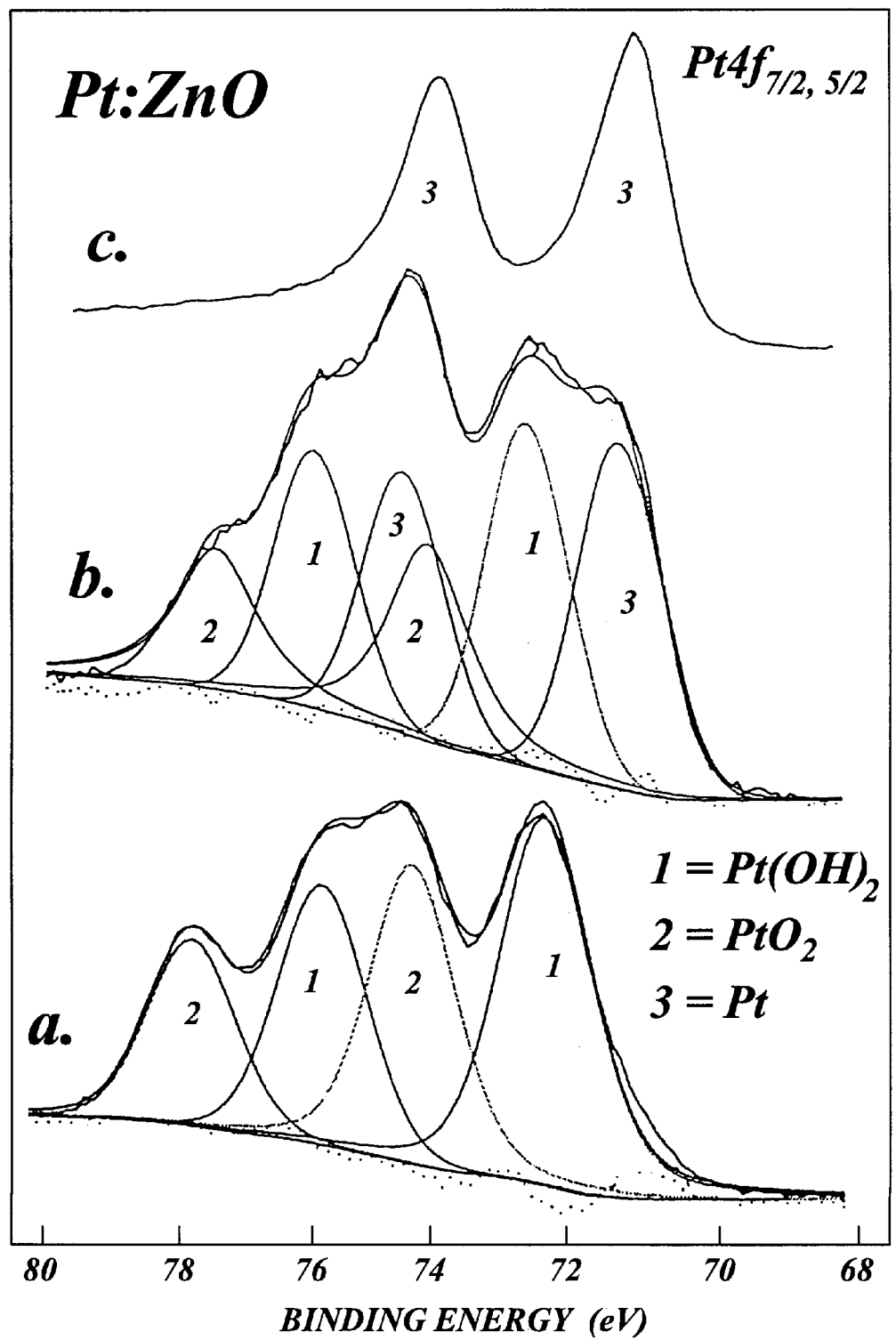
FIG. 2 is a graph of X-ray Photoelectron Spectra (XPS) of Pt:ZnO film before and after a gas phase reduction.

Spectra a in FIG. 2 is for a Pt:ZnO film prior to exposure to reducing conditions. Spectra b, c in FIG. 1 is for Pt:ZnO film after reduction in hydrogen gas for increasing time from 10 min (b) to 30 min (c). These spectra demonstrate increasing amounts of reduced platinum with increased time of exposure to reducing conditions. Resistivity data for Pt:ZnO films are also summarized in Table E2-1.

TABLE E2-1

Resistivity in Pt:ZnO Films Reduced in Hydrogen

| Sample | Time (min) | [Pt] | [Pt(OH)$_2$] | [PtO$_2$] | ρ (ohm-cm) |
|---|---|---|---|---|---|
| A | 0 | 0 | 58 | 42 | >1000 |
| B | 10 | 37 | 40 | 23 | 1.04 |
| C | 30 | 100 | 0 | 0 | 0.118 |

Resistivity of ZnO films doped with other noble metals is shown in Table E2-2.

TABLE E2-2

Resistivity of noble metal doped ZnO following reduction in 1 atm flowing Ar/4 vol % H$_2$

| Film | Substrate | Film Thickness (nm) | Deposition Method | Reducing Conditions (min/° K.) | ρ (ohm-cm) |
|---|---|---|---|---|---|
| 2GO | SiO$_2$ | 650 | Sputtered | 30/675 | 0.0433 |
| 2% Ga:O | Si | 650 | Sputtered | 30/675 | 0.0017 |
| 2% Ga:ZnO | — | 637 | Sputtered | 30/675 | 0.00174 |
| 1% Au:ZnO | — | 258 | Solution | 30/725 | 1.32 |
| 1% Au:ZnO | — | 240 | Solution | 60/725 | 0.0831 |
| 1% Au:ZnO | — | 285 | Solution | 90/725 | 0.0247 |
| 2% Pd:ZnO | — | 425 | Solution | 60/725 | 0.0851 |

Noble metal doped films were treated by applying much lower voltages (compared to Example 1) sufficient to reduce the dopant only. Neutral hydrogen was produced for dopants having a reduction potential above that of hydrogen, and was not produced for dopants (e.g. Pt) having a reduction potential less than that of hydrogen. In the constant voltage electrochemical tests, current flowed at a fixed potential until the dopant Pt was reduced. Increase of the potential resulted in reduction of Zn. Both reductions are accompanied by observable color changes of the film.

Analysis of both the gas phase and electrochemically reduced Pt-doped thin films using XPS showed that the dopant Pt undergoes gradual transformation from $Pt^{+4}$ to $pt^{+2}$ followed by formation of PtO. This transformation was accompanied by an increase in conductivity.

Figure 3:
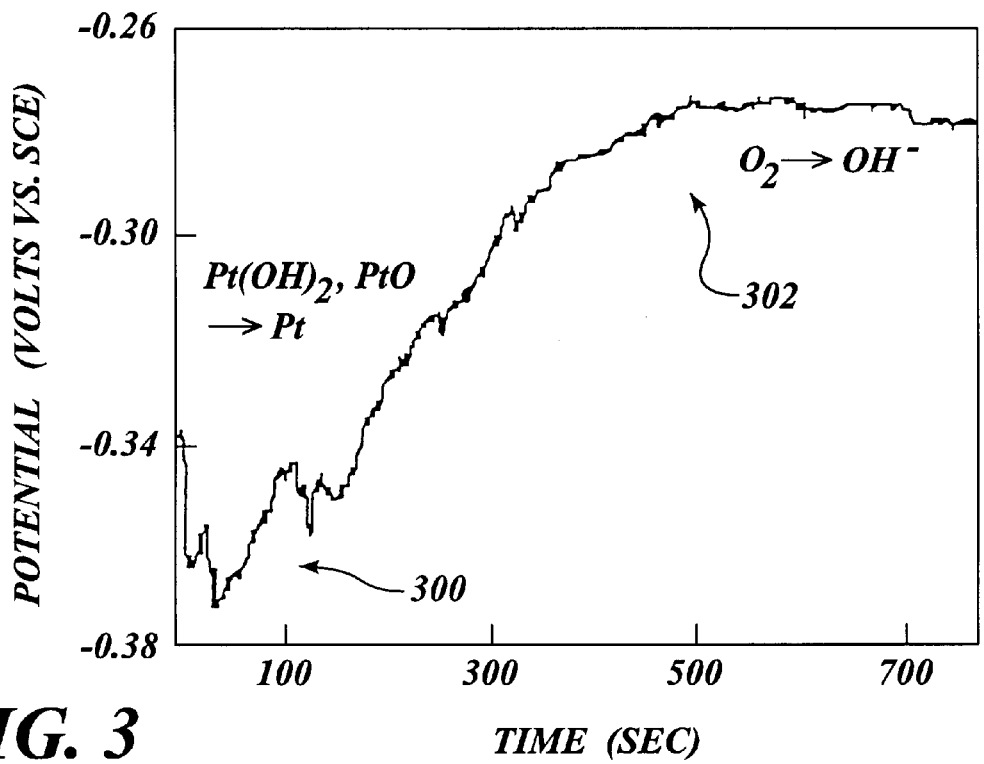
FIG. 3 is a graph of electrical potential versus time for electrochemical reduction of Pt:ZnO with a current density of 10 $\mu A/cm^2$.

The conductivity as a function of time is shown in FIG. 3 for electrochemical reduction for cathodic current density of 10 $\mu A/cm^2$. The current observed during the initial minimum 300 is from the transformation of platinum oxides/hydroxides in the film to zero valent platinum, making the film conductive. After the film becomes conductive (reduction of platinum oxides/hydroxides was complete), the potential rises to a higher level 302 whereupon reduction of dissolved molecular oxygen in the electrolyte begins.

Figure 4:
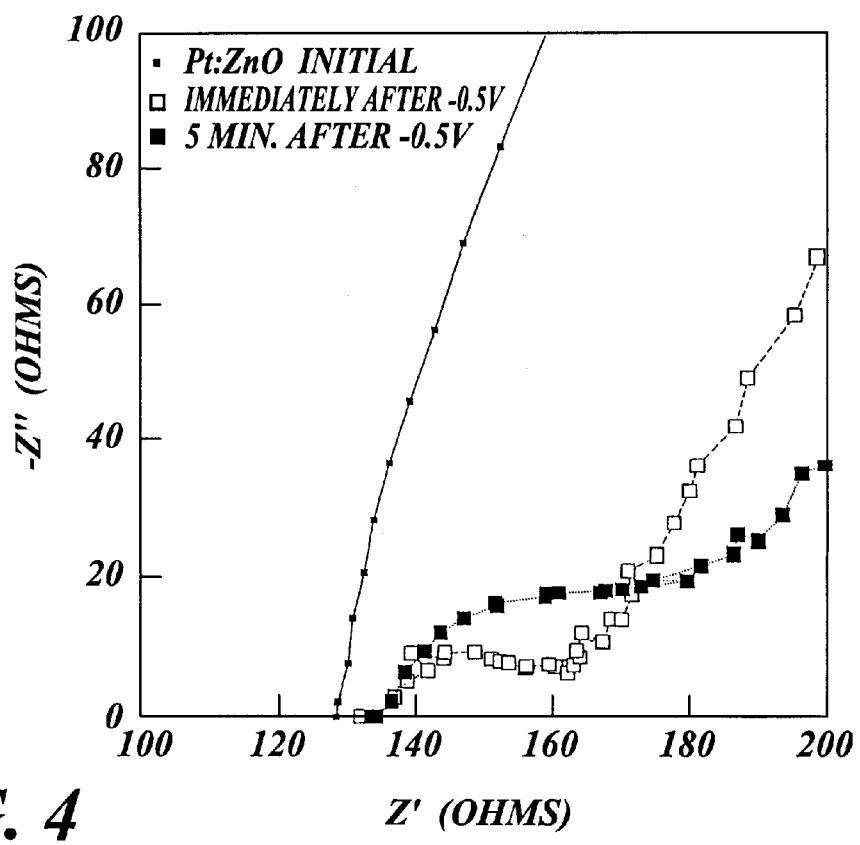
FIG. 4 is an impedance plot of Pt:ZnO before and after electrochemical reduction.

An impedance plot (FIG. 4) is shown for Pt:ZnO. Interpretation of the data is as for Example 1. In FIG. 4, the solid small squares provide a large diameter semicircle for an oxidized Pt:ZnO film. An electrochemical reduction was done using –0.5 V. Because platinum has a reduction potential below that of hydrogen, the lower –0.5V potential was used rather than the –1.5 V potential for hydrogen reduction, thereby achieving a direct reduction of the platinum. The reduced film was left in solution and an oxidizing potential applied. Measurements taken immediately after reduction (open large squares) and 5 minutes after (closed large squares) show small diameter semicircles indicating low resistivity. A slight diameter increase was noted for the 5-minute measurements. This increase is an order of magnitude less than the increase for neat ZnO.

In addition, samples of reduced Pt:ZnO films were removed from the electrochemical cell and placed in air. Measurements with a voltmeter indicated no change in resistivity over time with exposure to air.

Thus, the noble metal doped ZnO films resisted re-oxidation.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. In a film of a metal oxide having a lattice structure, useful for making a transparent conductive metal oxide film, said metal oxide having a first metal and a dopant, a method of reducing said dopant wherein the first metal is substantially not reduced, the method comprising the steps of:
   (a) selecting said dopant with a reducing potential less than a reducing potential of said first metal in said metal oxide; and
   (b) exposing the film to reducing conditions for a predetermined time and reducing a valence of the dopant from a positive valence to a zero valence and maintaining atoms of said dopant with a zero valence in an atomic configuration within the lattice structure, thereby producing the transparent conductive metal oxide film that is stable, resisting oxidation of the reduced dopant.

2. The method as recited in claim 1, wherein said dopant contains a noble metal.

3. The method as recited in claim 2, wherein exposing the film to reducing conditions comprises the steps of:
   (a) exposing said film to an atmosphere of gaseous neutral hydrogen at a temperature of at least about 400° C.; and
   (b) withdrawing said film from said atmosphere after a predetermined time.

4. The method as recited in claim 1, wherein exposing the film to reducing conditions comprises the steps of:
   (a) using the film as a first electrode in an electrochemical cell;
   (b) placing the first electrode together with a counter electrode in an electrolyte in an electrochemical cell;
   (c) selecting a voltage sufficient to reduce the dopant;
   (d) applying the voltage and maintaining the voltage substantially constant until the current falls to nearly zero indicating completion of the reduction of the dopant; and
   (e) removing the reduced metal oxide from the electrochemical cell.

5. The method as recited in claim 4, wherein said reducing potential of said metal dopant is greater than a reducing potential of neutral hydrogen, wherein said selected voltage is at about the reducing potential of neutral hydrogen and said neutral hydrogen reduces the dopant.

6. The method as recited in claim 4, wherein said reducing potential of said metal dopant is less than a reducing potential of neutral hydrogen, wherein said dopant is directly electrochemically reduced.

7. The method as recited in claim 1, wherein said film is on a substrate.

8. The method as recited in claim 7, wherein said substrate is a conductive substrate.

9. The method as recited in claim 8, wherein said conductive substrate is a semiconductor.

10. The method as recited in claim 8, wherein said substrate is a metal.

11. A method for making a transparent conductive metal oxide thin film on a conductive substrate, from a metal oxide comprising the steps of:

(a) depositing the metal oxide as a thin film onto the semiconductor substrate with a metal within the metal oxide in an oxidized state, and forming a coated semiconductor; and (b) exposing the coated semiconductor to reducing conditions for a predetermined time and reducing up to about 2 atomic % of the metal of the metal oxide in the metal oxide thin film.

12. The method as recited in claim 11, wherein the oxidized metal is the metal of the metal oxide.

13. The method as recited in claim 11, wherein the oxidized metal is a dopant and the metal of the metal oxide is substantially not reduced.

14. The method as recited in claim 13, wherein exposing the film to reducing conditions comprises the steps of:

(a) using the doped metal oxide as a first electrode in an electrochemical cell;

(b) placing the first electrode together with a counter electrode in an electrolyte in an electrochemical cell;

(c) selecting a voltage sufficient to reduce the dopant, but insufficient to reduce the metal in the doped metal oxide;

(d) applying the voltage and maintaining the voltage substantially constant until the current falls to nearly zero indicating completion of the reduction of the dopant; and (e) removing the reduced dopant doped metal oxide from the electrochemical cell.

15. The method as recited in claim 13, wherein said dopant is a noble metal oxide and said first metal is a transition metal.

16. The method as recited in claim 11, wherein exposing the film to reducing conditions comprises the steps of:

(a) exposing said film to an atmosphere of a reducing gas at a temperature of at least about 400° C.;

(b) withdrawing said film from said atmosphere after a predetermined time.

17. The method as recited in claim 15, wherein said reducing gas is neutral hydrogen.

\* \* \* \* \*

UNITED STATES PATENT AND TRADEMARK OFFICE
CERTIFICATE OF CORRECTION

PATENT NO. : 5,990,416
DATED : November 23, 1999
INVENTOR(S) : Windisch Jr. et al.

It is certified that error appears in the above-identified patent and that said Letters Patent is hereby corrected as shown below:

<u>Column 7,</u>
Line 42, please replace "pt+$^2$ followed by formation of PtO." with -- Pt$^{+2}$ followed by formation of Pt$^0$. --

Signed and Sealed this

Seventh Day of May, 2002

Attest:

JAMES E. ROGAN
*Attesting Officer*   *Director of the United States Patent and Trademark Office*